United States Patent
Xu et al.

(10) Patent No.: US 9,739,659 B2
(45) Date of Patent: Aug. 22, 2017

(54) OPTICAL SENSOR ARRANGEMENT AND METHOD FOR LIGHT SENSING

(71) Applicant: ams AG, Unterpremstaetten (AT)

(72) Inventors: Gonggui Xu, Plano, TX (US); Andreas Fitzi, Staefa (CH)

(73) Assignee: AMS AG, Unterpremstaetten (AT)

( * ) Notice: Subject to any disclaimer, the term of this patent is extended or adjusted under 35 U.S.C. 154(b) by 319 days.

(21) Appl. No.: 14/515,376

(22) Filed: Oct. 15, 2014

(65) Prior Publication Data
US 2015/0102209 A1 Apr. 16, 2015

Related U.S. Application Data

(60) Provisional application No. 61/890,944, filed on Oct. 15, 2013.

(30) Foreign Application Priority Data

Oct. 23, 2013 (EP) ..................................... 13189901

(51) Int. Cl.
| | | |
|---|---|---|
| H01J 40/14 | (2006.01) |
| G01J 1/42 | (2006.01) |
| G01J 1/46 | (2006.01) |
| G01J 1/44 | (2006.01) |

(52) U.S. Cl.
CPC .............. G01J 1/4204 (2013.01); G01J 1/44 (2013.01); G01J 1/46 (2013.01); G01J 2001/446 (2013.01)

(58) Field of Classification Search
CPC ...................................... G01J 1/42; G01J 1/46
USPC ........... 250/214 R, 214 A, 214 DC; 341/110, 341/126, 155, 156
See application file for complete search history.

(56) References Cited

U.S. PATENT DOCUMENTS

| | | | |
|---|---|---|---|
| 6,961,746 B1 | 11/2005 | Tang | |
| 7,812,755 B2 * | 10/2010 | Vampola | G06J 1/00 341/143 |
| 2006/0180747 A1 | 8/2006 | Liang et al. | |
| 2011/0006188 A1* | 1/2011 | Lin | G01J 1/44 250/201.1 |
| 2012/0293472 A1 | 11/2012 | Wong et al. | |
| 2013/0120761 A1 | 5/2013 | Dyer et al. | |

OTHER PUBLICATIONS

De Maeyer, Jeroen et al.: "A Double-Sampling Extended-Counting ADC", IEEE Journal of Solid-State Circuits, vol. 39, No. 3, Mar. 2004, pp. 411-418.
Jansson, Christer: "A High-Resolution, Compact, and Low-Power ADC Suitable for Multi-Channel Implementation: Measurements and Methods of Self-Calibration", IEEE 1996 Symposium on VLSI Circuits Digest of Technical Papers, pp. 92-93.

(Continued)

Primary Examiner — Kevin Pyo
(74) Attorney, Agent, or Firm — McDermott Will & Emery LLP

(57) ABSTRACT

An optical sensor arrangement (10) comprises a photodiode (11) for providing a sensor current (IPD) and an analog-to-digital converter arrangement (12) which is coupled to the photodiode (11) and determines a digital value of the sensor current (IPD) in a charge balancing operation in a first phase (A) and in another conversion operation in a second phase (B).

11 Claims, 11 Drawing Sheets

(56) References Cited

OTHER PUBLICATIONS

TSL2560, TSL2561: "Light-to-Digital Converter" Data Sheet, TAOS Inc., TAOS059Q Nov. 2009, pp. 1-42.
Wang, Yan et al.: "Noise-Coupled Low-Power Incremental ADCs", Proceedings of 2010 IEEE International Symposium on Circuits and Systems, 2010, pp. 4001-4004.

* cited by examiner

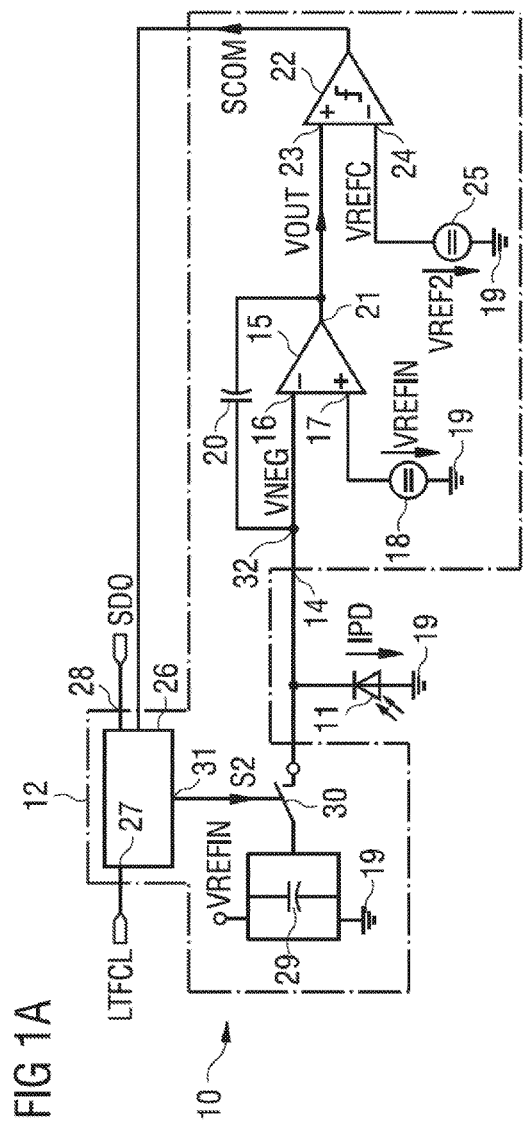

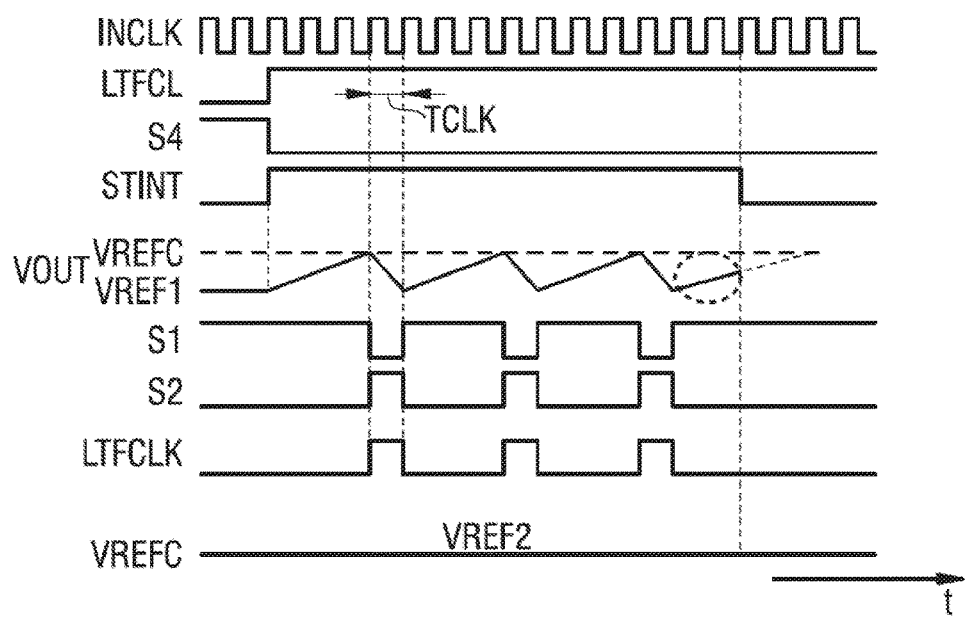
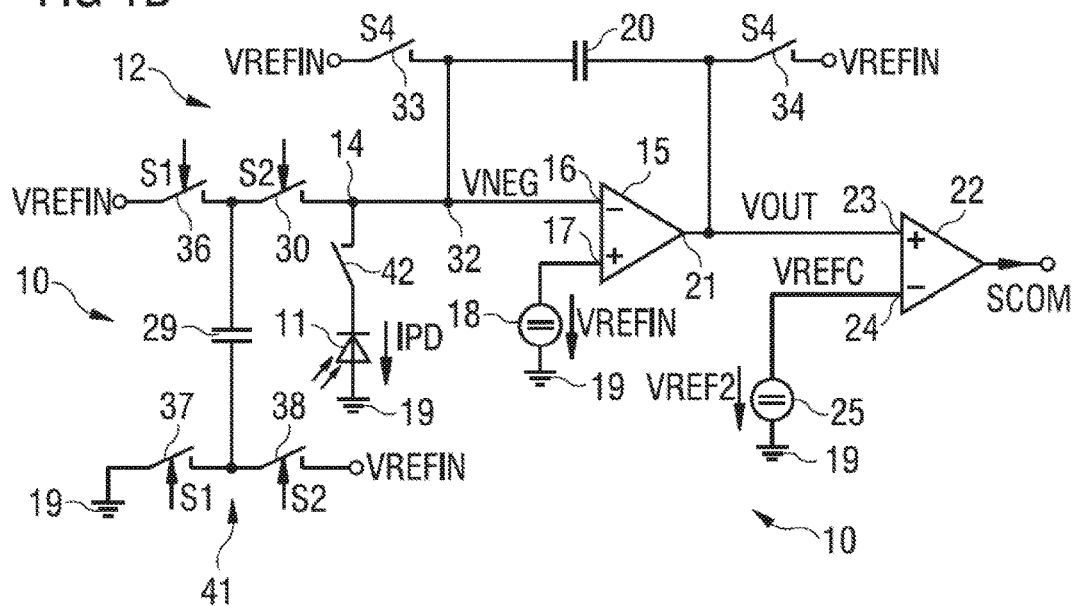

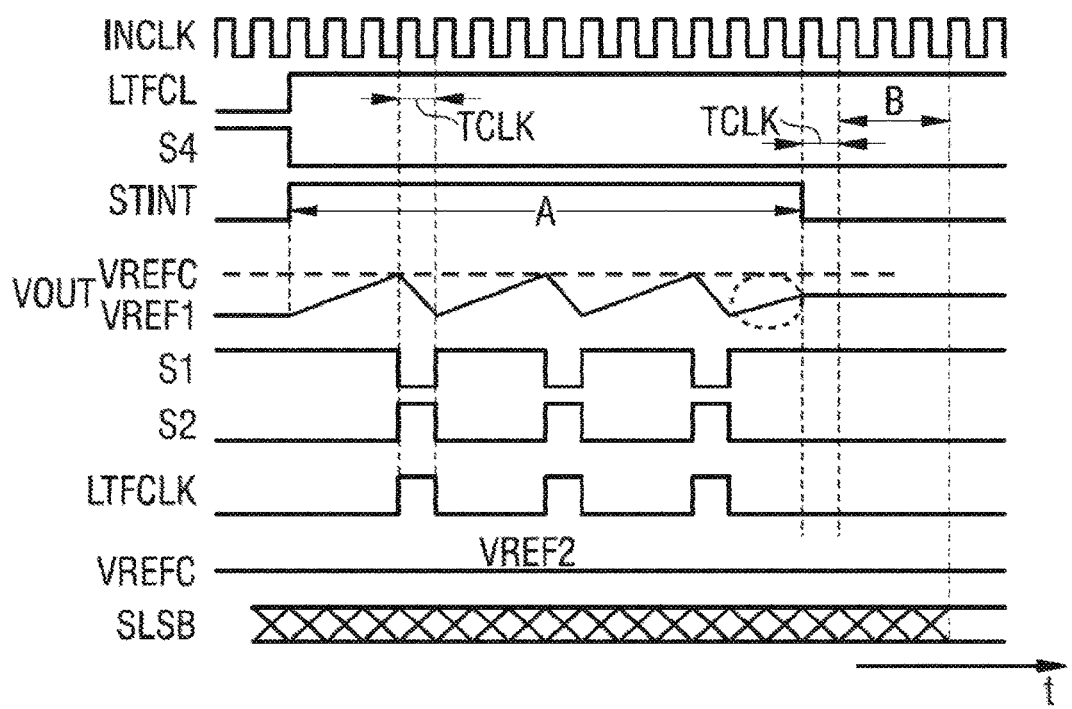

OPTICAL SENSOR ARRANGEMENT AND METHOD FOR LIGHT SENSING

CROSS-REFERENCE TO RELATED APPLICATIONS

The present application claims the benefit of priority under 35 U.S.C. §119 from U.S. Provisional Patent Application Ser. No. 61/890,944, filed on Oct. 15, 2013, and claims priority to European Patent Application No. 13189901.5 filed on Oct. 23, 2013, both disclosures of which are hereby incorporated by reference in their entirety for all purposes.

FIELD OF THE INVENTION

The present invention is related to an optical sensor arrangement and a method for light sensing.

BACKGROUND OF THE INVENTION

An optical sensor arrangement often comprises a photodiode as a light sensor and an analog-to-digital converter. Such a photodiode can be used for ambient light sensing. An ambient light sensor may be buried underneath a dark glass, for example, in mobile phone applications, to create a stylish look. Since an incident light is strongly attenuated by the covering dark glass, an ambient light sensor should obtain a high sensitivity.

Document US 2012/0293472 A1 describes an ambient light sensor. A light detector is coupled to an analog-to-digital converter via a filtering circuitry.

SUMMARY OF THE INVENTION

In an embodiment an optical sensor arrangement comprises a photodiode for providing a sensor current and an analog-to-digital converter arrangement which is coupled to the photodiode. The analog-to-digital converter arrangement determines a digital value of the sensor current in a charge balancing operation in a first phase and in another conversion operation in a second phase.

In an embodiment the optical sensor arrangement and a method for light sensing have a high sensitivity.

Advantageously, two phases are used for the digitalization of the sensor current. Whereas a rough digitalization is performed during the first phase, a fine digitalization is achieved during the second phase. The conversion operation of the second phase is different from the conversion operation of the first phase. The second phase follows the first phase.

In an embodiment the converter arrangement uses the principle of successive approximation in the second phase.

In an embodiment the digital value of the sensor current comprises a first and a second series of bits. The bits of the first series are determined in the first phase, whereas the bits of the second series are determined in the second phase. The first series of bits comprises the most significant bit. Correspondingly, the second series of bits comprises the least significant bit. The first series of bits is determined by the charge balancing operation of the analog digital converter arrangement. The second series of bits is determined by the other conversion operation.

In an embodiment the converter arrangement comprises an amplifier having an amplifier input and an amplifier output. The photodiode is coupled to the amplifier input.

In an embodiment the converter arrangement comprises a comparator having a comparator input. The comparator input is coupled to the amplifier output.

In an embodiment the amplifier generates an output voltage at the amplifier output. The output voltage is provided to the comparator input. A value of the output voltage that is tapped at the end of the first phase is used for further digitalization in the second phase. Thus, the second series of bits is determined using the value of the output voltage at the end of the first phase.

The amplifier and the comparator may both be used in the first phase.

In an embodiment the amplifier is also used in the second phase.

In an embodiment the comparator is also used in the second phase.

Thus, at least one of the amplifier and the comparator may be used in the first phase as well as in the second phase.

In an embodiment the converter arrangement comprises an integrating capacitor. The integrating capacitor couples the amplifier output to the amplifier input. The amplifier and the integrating capacitor form integrator. The integrator may be realized as an inverse integrator.

In an embodiment the converter arrangement comprises a reference capacitor. The reference capacitor is coupled to the amplifier input. The reference capacitor is designed for providing a charge package to the amplifier input. Whereas the photodiode provides a charge of a first polarity to the amplifier input, the reference capacitor provides a charge with a second polarity, which is opposite to the first polarity, to the amplifier input.

In an embodiment the analog-to-digital converter arrangement comprises a photodiode switch such that a series connection of the photodiode and the photodiode switch couples the amplifier input to a reference potential terminal.

In an embodiment the photodiode switch is closed during the first phase and is open during the second phase. The photodiode provides the sensor current to the amplifier input in the first phase. The photodiode does not provide the sensor current to the amplifier input in the second phase.

In an embodiment a method for light sensing comprises generating a sensor current by a photodiode, providing the sensor current to an analog-to-digital converter arrangement and determining a digital value of the sensor current by the analog-to-digital converter arrangement in a charge balancing operation in a first phase and in another conversion operation in a second phase.

Advantageously, a precise digitalization of the sensor current is achieved by the two operation methods used in the first and the second phase.

The optical sensor arrangement can be implemented as an ambient light sensor, abbreviated to ALS. Thus, the optical sensor arrangement is designed to measure an ambient light brightness.

A consumer electronics device may comprise the optical sensor arrangement. The optical sensor arrangement may be applied for display management. For example, the optical sensor arrangement is used for the controller of a backlight illumination. If the ambient light is bright, a higher backlight illumination for a display panel is set. If the ambient light is dark, a lower backlight illumination for the display panel can be used. By dynamically adjusting the display panel brightness, the optical sensor arrangement advantageously contributes to optimize the operation power of the display panel.

In an embodiment the optical sensor arrangement is used for controlling keyboard illumination based upon ambient lighting conditions. Alternatively, the optical sensor arrangement is used to manage exposure control in digital cameras.

Thus, the optical sensor arrangement may be part of a notebook, a tablet personal computer, a liquid crystal display monitor, a flat-panel television apparatus, a cell phone and/or a digital camera. In addition, the optical sensor arrangement may be part of security lighting, a streetlight control, sunlight harvesting, machine vision and/or an automotive instrumentation cluster.

BRIEF DESCRIPTION OF THE DRAWINGS

The following description of figures of exemplary embodiments may further illustrate and explain the invention. In so far as components, circuits and method steps correspond to one another in terms of their function in different figures, the description thereof is not repeated for each of the following figures.

FIGS. 1A to 1D show exemplary embodiments of an optical sensor arrangement and of a timing diagram of signals.

FIGS. 2A and 2B show a further exemplary embodiment of the optical sensor arrangement and of a timing diagram.

DETAILED DESCRIPTION OF THE DRAWINGS

Figure 1B:
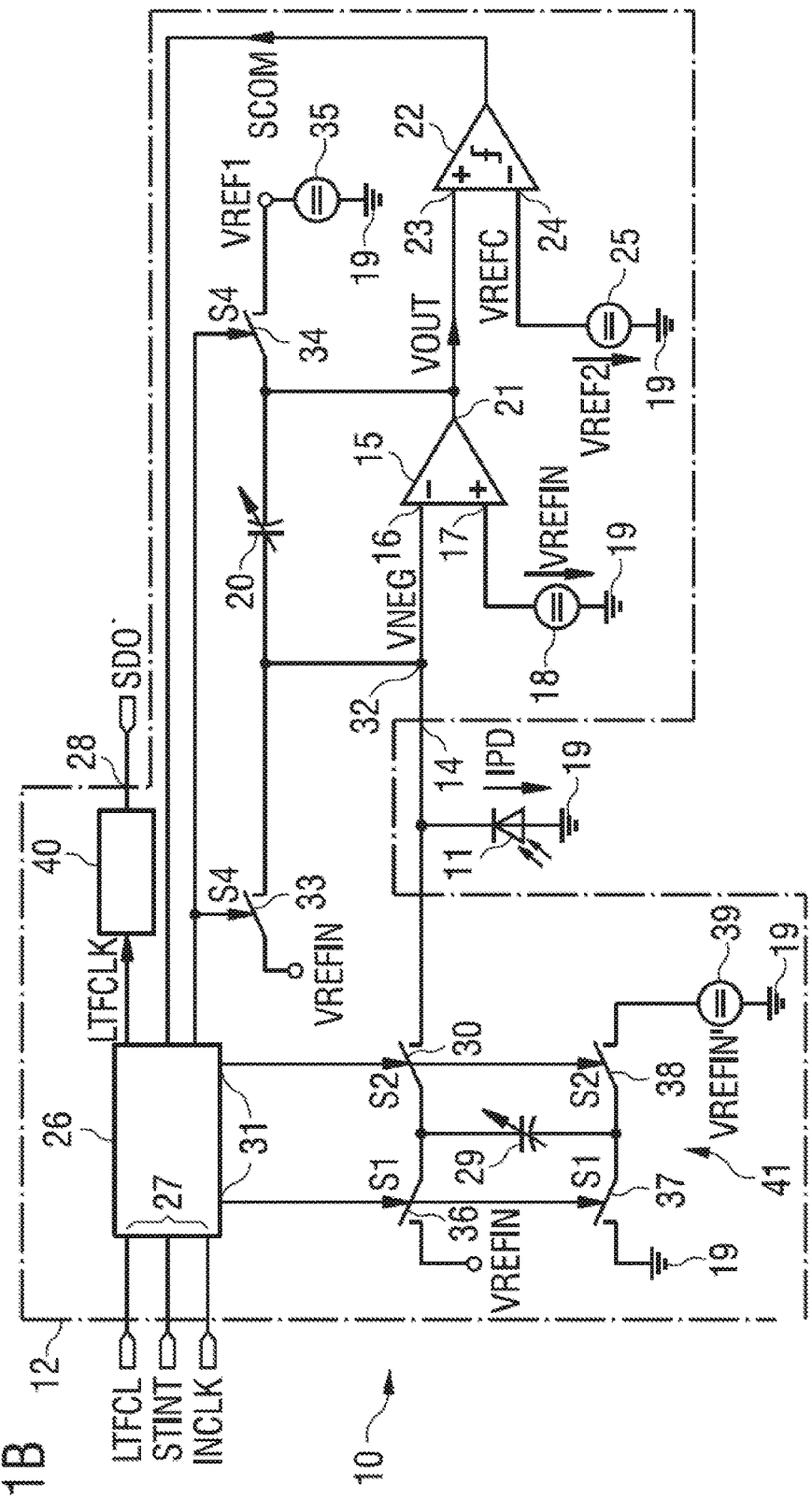

FIG. 1A shows an exemplary embodiment of an optical sensor arrangement 10. The optical sensor arrangement 10 comprises a photodiode 11 and an analog-to-digital converter arrangement 12, abbreviated to converter arrangement. The photodiode 11 is connected to an input 14 of the converter arrangement 12. The converter arrangement 12 comprises an amplifier 15 having an amplifier input 16 connected to the input 14 of the converter arrangement 12. The amplifier input is realized as an inverting input. The amplifier 15 comprises a further amplifier input 17 that is designed as a non-inverting input. The photodiode 11 connects the input 14 of the converter arrangement 12 to a reference potential terminal 19. A first bias source 18 couples the further amplifier input 17 to the reference potential terminal 19. An integrating capacitor 20 of the converter arrangement 12 connects the amplifier input 16 to an amplifier output 21 of the amplifier 15.

Furthermore, the converter arrangement 12 comprises a comparator 22 having a comparator input 23 that is connected to the amplifier output 21. The comparator input 23 is implemented as a non-inverting input. A further comparator input 24 of the comparator 22 is realized as an inverting input. A reference voltage source 25 connects the further comparator input 24 to the reference potential terminal 19. An output of the comparator 22 is connected to a digital control circuit 26 of the converter arrangement 12. The digital control circuit 26 comprises a control input 27 and a result output 28.

Moreover, the converter arrangement 12 comprises a reference capacitor 29. The reference capacitor 29 is coupled via a reference switch 30 of the converter arrangement 12 to the input 14 of the converter arrangement 12. Thus, the reference capacitor 29 is coupled to the amplifier input 16 by the reference switch 30. A control output 31 of the digital control circuit 26 is connected to a control terminal of the reference switch 30. The first bias source 18 is coupled to the reference capacitor 29.

The photodiode 11 generates a sensor current IPD. The sensor current IPD is implemented as a photon current. The value of the sensor current IPD depends on the brightness of the light falling on the photodiode 11. The sensor current IPD flows through the photodiode 11 and the input 14 of the converter arrangement 12. The photodiode 11, the amplifier input 16 and the integrating capacitor 20 are each connected to an integration node 32. Also the reference capacitor 29 is coupled to the integration node 32 via the reference switch 30. The sensor current IPD flows from the integration node 32 to the reference potential terminal 19 with a positive value.

An input voltage VNEG is tapped at the amplifier input 16 and thus also at the integration node 32. The first bias source 18 provides an amplifier reference voltage VREFIN to the further amplifier input 17. The amplifier 15 generates an output voltage VOUT at the amplifier output 21. In the case that the reference switch 30 is open, the sensor current IPD is integrated on the integrating capacitor 20. The output voltage VOUT rises according to the following equation:

$$VOUT = \frac{IPD \cdot t}{CINT},$$

wherein IPD is a value of the sensor current flowing for a duration t and CINT is a capacitance value of the integrating capacitor 20.

The output voltage VOUT of the amplifier 15 is applied to the comparator input 23. The reference voltage source 25 generates a bias voltage VREF2 which is applied as a comparator reference voltage VREFC to the further comparator input 24. The comparator 22 generates a comparator output signal SCOM depending on the values of the output signal VOUT and of the comparator reference voltage VREFC. The comparator output signal SCOM has a first logical value if the output voltage VOUT is larger than the comparator reference voltage VREFC and has a second logical value if the output voltage VOUT is smaller than the comparator reference voltage VREFC. The comparator output signal SCOM is provided to the digital control circuit 26. The digital control circuit 26 counts the pulses of the comparator output signal SCOM and provides the result as a digital output signal SDO of the converter arrangement 12.

An input control signal LTFCL is provided to the control input 27 of the digital control circuit 26. The operation of the converter arrangement 12 is triggered by the input control signal LTFCL. The first bias source 18 provides the amplifier reference voltage VREFIN to the reference capacitor 29. The reference capacitor 29 generates a charge package QREF. The charge package QREF has a value according to the following equation:

$$QREF = VREFIN \cdot CREF,$$

wherein CREF is a capacitance value of the reference capacitor 29 and VREFIN is a voltage value of the amplifier reference voltage. The digital control circuit 26 provides a second reference switch signal S2 to the reference switch 30. After closing the reference switch 30, the charge package QREF is applied to the integration node 32.

In an alternative embodiment not shown, the first bias source 18 is omitted. The amplifier reference voltage VREFIN is zero.

FIG. 1B shows a further embodiment of the optical sensor arrangement 10 that is a further development of the embodiment shown in FIG. 1A. The converter arrangement 12 comprises a first and a second discharging switch 33, 34. The first discharging switch 33 couples a first electrode of the integrating capacitor 20 to the first bias source 18. The second discharging switch 34 couples a second electrode of the integrating capacitor 20 to a first reference source 35. The first electrode of the integrating capacitor 20 is connected to the amplifier input 16. The second electrode of the integrating capacitor 20 is connected to the amplifier output 21. Thus, the amplifier reference voltage VREFIN is provided via the first discharging switch 33 to the first electrode of the integrating capacitor 20. Furthermore, a first reference voltage VREF1 is provided by the first reference source 35. The first reference voltage VREF1 is provided via the second discharging switch 34 to the second electrode of the integrating capacitor 20. A discharging control signal S4 provided by the digital control circuit 26 controls the first and the second discharging switch 33, 34. The integrating capacitor 20 is implemented as a variable capacitor. The capacitance value CINT of the integrating capacitor 20 can be set by a capacitor control signal.

The reference capacitor 29 obtains a variable capacitance value CREF. The capacitance value CREF of the reference capacitor 29 is set by a further capacitor control signal. The integrating capacitor 20 and the reference capacitor 29 can be programmed for different ambient light sensor gains.

Moreover, the converter arrangement 12 comprises a switching network 41. The switching network 41 comprises the reference switch 30 and a first to a third reference switch 36 to 38. The first reference switch 36 couples the first bias source 18 to a first electrode of the reference capacitor 29. The reference switch 30 couples the first electrode of the reference capacitor 29 to the amplifier input 16. The second reference switch 37 couples a second electrode of the reference capacitor 29 to the reference potential terminal 19. The third reference switch 38 couples a second reference source 39 to the second electrode of the reference capacitor 29. The second reference source 39 generates a second reference voltage VREFIN'. For charging the reference capacitor 29 the first and the second reference switch 36, 37 are closed and the third reference switch 38 and the reference switch 30 are opened by a first and the second reference switch signal S1, S2. The first and the second reference switch signals S1, S2 are non-overlapping clock signals. For dumping the charge package QREF to the amplifier input 16, the first and the second reference switch 36, 37 are opened and the third reference switch 38 and the reference switch 30 are closed by the first and the second reference switch signal S1, S2.

Moreover, a clock signal INCLK, an integration time signal STINT and the input control signal LTFCL are provided to the control input 27 of the digital control circuit 26. Moreover, the converter arrangement 12 comprises a counter 40 that couples an output of the digital control circuit 26 to the result output 28 of the converter arrangement 12. The digital control circuit 26 generates an output signal LTFCLK depending on the comparator output signal SCOM. The counter counts the pulses of the output signal LTFCLK and generates the digital output signal SDO.

Advantageously, the first reference voltage VREF1 corresponds to the output signal VOUT if a signal difference between the voltages at the amplifier input 16 and the further amplifier input 17 is zero.

FIG. 1C shows an exemplary embodiment of a timing diagram of the signals of the optical sensor arrangement 10 of FIGS. 1A and 1B. As illustrated in FIG. 1C, the clock signal INCLK, the input control signal LTFCL, the discharging control signal S4, the integration time signal STINT, the output voltage VOUT, the first and the second reference switch signal S1, S2, the output signal LTFCLK and the comparator reference voltage VREFC depend on a time t.

The optical sensor arrangement 10 is implemented as ambient light sensor. The basic operation principle is that the charge-balancing converter arrangement 12 collects the sensor current IPD that is a photon current from the photodiode 11 into counts of the optical sensor arrangement 10. The photodiode 11 converts an incident light into the sensor current IPD. The converter arrangement 12 is realized as a charge-balancing converter arrangement. The converter arrangement 12 is used for a conversion of the sensor current IPD to a digital count in the form of the digital output signal SDO. The sensor current IPD is integrated into the integration node 32 and the integration capacitor 20 producing the input voltage VNEG. If the charge integrated into the integration capacitor 20 is larger than the unit charge packet QREF=CREF·VREFIN, the charge on the integration capacitor 20 will be decreased by one unit charge packet and the counter 40 will be incremented by one. The integration time signal STINT determines an integration time TINT. By integrating the sensor current IPD during the integration time TINT, the digital output signal SDO provided by the counter 40 will give the brightness of ambient light. The integration time TINT may be 100 ms for example. The integration time TINT is a multiple of a period of the clock signal INCLK. The comparator reference voltage VREFC is constant and is equal to the bias voltage VREF2.

A measurement is performed using the following steps: Initially, when the input control signal LTFCL is low, the converter arrangement 12 is reset: The photodiode 11 is cleared; the integration capacitor 20 is cleared; the input voltage VNEG is reset to the amplifier reference voltage VREFIN; the output voltage VOUT is reset to the first reference voltage VREF1 and thus lower than the comparator reference voltage VREFC; the comparator output signal SCOM is low; the reference capacitor 29 is fully charged with the charge package QREF and disconnected from the integration node 32; the counter 40 is cleared so that the digital output signal SDO is 0. The first control signal S1 and the discharging control signal S4 are high and the second control signal S2 is low.

When the input control signal LTFCL transits from low to high, the integration time signal STINT transits from low to high at the same time. Thus, the converter arrangement 12 starts operation: the discharging control signal S4 is low; the sensor current IPD of the photodiode 11 is integrated by an integrator comprising the amplifier 15 and the integrating capacitor 20. The sensor current IPD is integrated at the integration node 32 and the output voltage VOUT is ramping up during integration. The comparator 22 monitors the output voltage VOUT of the integrator that is the output voltage VOUT of the amplifier 15. When the output voltage VOUT is larger than the comparator reference voltage VREFC, the comparator output signal SCOM is high and this causes the charge packet QREF=VREFIN·CREF to be dumped into the integration node 32. The output signal LTFCLK goes high for a clock period. Therefore, the digital output signal SDO of the counter 40 will be incremented by one count. After the charge dumping the output voltage VOUT is reduced by the value VREFIN·CREF/CINT. The output voltage VOUT goes low again back to the level of the first reference voltage VREF1, is lower than the comparator reference voltage VREFC and ramps up back again. The charge packet circuit 29, 41 is disconnected from the integration node 32 and back to recharging mode. The number N of dumpings is increased by one count. The output voltage VOUT swings between the first reference voltage VREF1 and the bias voltage VREF2. This process will repeat itself until the integration time TINT is over, the signal STINT transits from high to low. During the integration time TINT, the signal STINT is high, the number of LTFCLK counts are accumulated by the counter 40. The counter value SDO is equal to the number N of dumpings and indicates the brightness of the incident light. The digital output signal SDO is equal to the number N of dumpings counted by the counter 40. The number N of charge dumping is equal to the counts of the counter 40 of the converter arrangement 12 and will be generated over a certain period of the integration time TINT.

As shown in FIG. 1C, when the integration is over, the integration time signal STINT transits from high to low, the output voltage VOUT had performed a ramp up to a value less than the comparator reference voltage VREFC and that information is not included into the digital output signal SDO. The number N of charge dumping (also the counts of the counter 40) are generated according to the charge conservation equation:

$$TINT \cdot IPD = N \cdot CREF \cdot VREFIN + QRES,$$

wherein TINT is the integration time and QRES is a residual charge at the end of the integration time TINT. The residual charge QRES is left over after the period marked by a dotted circle in FIG. 1C.

FIG. 1D shows an alternative exemplary embodiment of the optical sensor arrangement 10 that is a further development of the embodiments shown in FIGS. 1A and 1B. The optical sensor arrangement 10 comprise a photodiode switch 42. The photodiode switch 42 couples the photodiode 11 to the integration node 32 and to the amplifier input 16 via the input 14 of the converter arrangement 12. In a first phase A, the photodiode switch 42 connects the photodiode 11 to the integration node 32 and the input 16 of the amplifier via the input 14 of the converter arrangement 12. A further output of the digital control circuit 26 is coupled to a control terminal of the photodiode switch 42. The integration time signal STINT is provided to the control terminal of the photodiode switch 42. The photodiode switch is designed to connect and disconnect the photodiode 11 controlled by the integration time signal STINT.

In FIG. 1D, the amplifier reference voltage VREFIN is provided to the further amplifier input 17 and also to the first and second electrode of the integrating capacitor 20, when the first and the second discharging switch 23, 34 are closed. Moreover, the reference capacitor 29 is charged by the amplifier reference voltage VREFIN. Furthermore, the amplifier reference voltage VREFIN is provided to the second electrode of the reference capacitor 29 when the third reference switch 38 is closed. Thus, the number of reference voltages and of reference voltage sources is reduced. The converter arrangement 12 operates in the charge balancing mode that is illustrated in FIG. 1C.

Figure 2A:
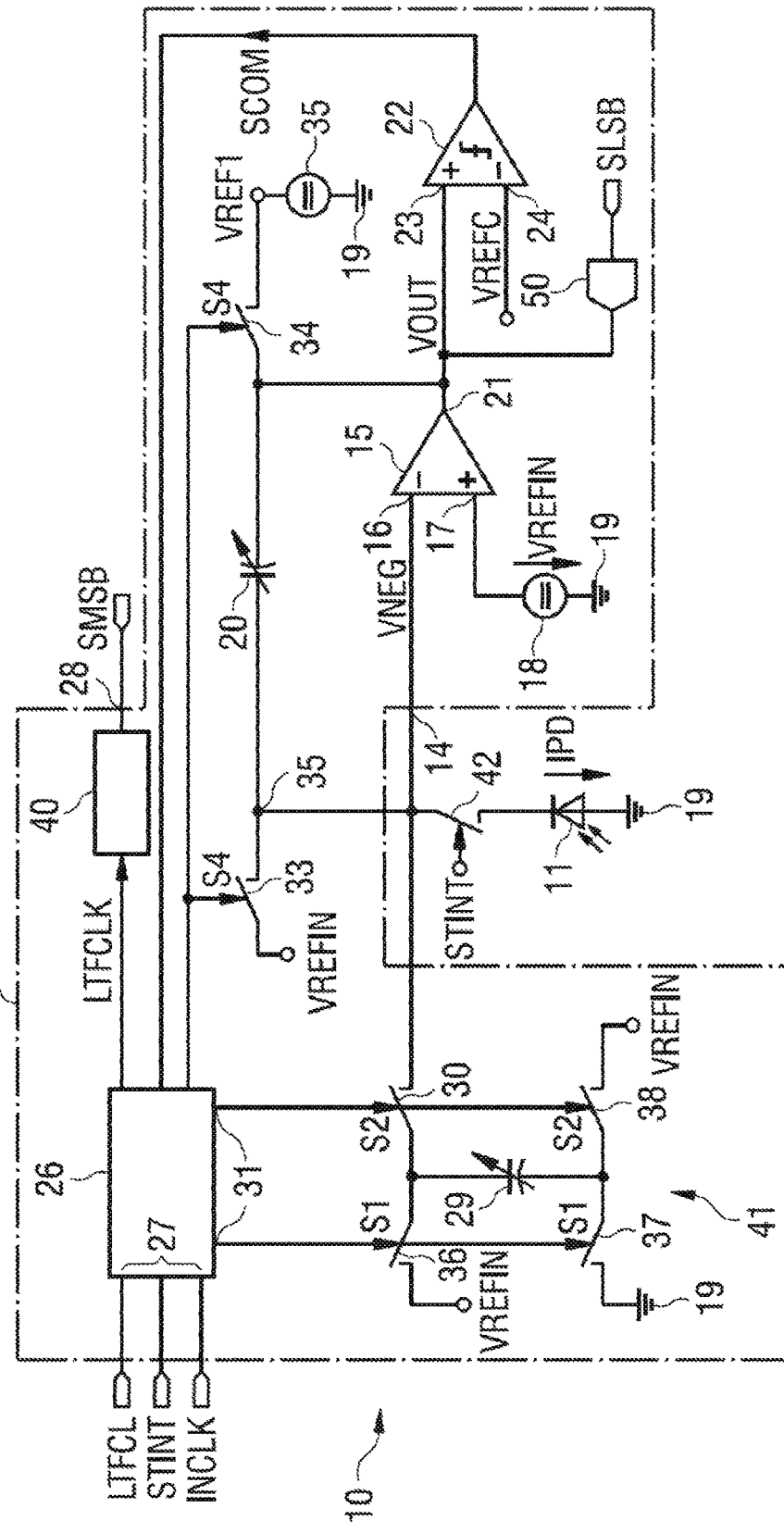

FIG. 2A shows an exemplary embodiment of the optical sensor arrangement 10 that is a further development of the embodiments shown in FIGS. 1A to 1D. In addition to the above shown optical sensor arrangements, the optical sensor arrangement 10 comprises an analog-to-digital converter 50 that is coupled to the amplifier output 21. The counter 40 outputs a first series of bits SMSB which are determined in the first phase A as shown in FIGS. 1A-1D. The first series of bits SMSB comprise the most significant bit. The analog-to-digital converter 50 outputs a second series of bits SLSB which are determined in a second phase B. The second series of bits SLSB comprises the least significant bit. The analog-to-digital converter 50 operates in the second phase B. The analog-to-digital converter 50 starts operation when the charge balancing operation of the converter arrangement 10 is finished. The output voltage VOUT at the comparator output 21 which can be tapped at the end of the first phase A is provided to the analog-to-digital converter 50 and is converted by the analog-to-digital converter 50 into the second series of bits SLSB. As a result the converter arrangement 10 provides the first series of bits SMSB and the second series SLSB. Thus, the sensor current IPD is converted into the first and the second series of bits SMSB, SLSB. The converter arrangement 10 is designed as a segmentation analog-to-digital converter arrangement.

FIG. 2B shows an exemplary embodiment of a timing diagram of the optical sensor arrangement 10 illustrated in FIG. 2A. The duration of the first phase A is controlled by the integration time signal STINT. The second phase B starts with a small delay after the end of the first phase A. The delay is for example one period of the clock signal INCLK. The left-over value of the output voltage VOUT at the end of the first phase A is digitized by the analog-to-digital converter 50. Therefore, more resolution is achieved. An information loss is avoided.

The analog-to-digital converter 50 is a sub-ranging analog-to-digital converter. The analog-to-digital converter is added to the main charge balancing converter arrangement 12 to digitize the left-over charge out of the main charge balancing converter arrangement 12. Therefore, the architecture improves sensitivity of the ambient light sensor. The low level incident light is integrated and not disturbed. The high level incident light will not saturate the analog-to-digital converter 50, since the integration will be cleared by charge packet dumping during the first phase A. The converter arrangement 12 performs a segmentation analog-to-digital conversion. The most significant bits SMSB are generated from charge-balancing during a long integration time TINT; the least significant bits SLSB are generated after integration from the sampled and held left-over output voltage VOUT by the digitizing scheme of the analog-to-digital converter 50. The segmentation increases the dynamic range, in particular for the lower incident light.

Thus, the ambient light photon current digitization is separated into two segments. In the first phase A or first segment, during the long integration time TINT, the main charge-balancing analog-to-digital converter is used and the number of charge packet dumping represents the most significant bits SMSB. The timing is adjusted in comparison to FIG. 1C: The reference switch 30 and the discharging switches 33, 34 will remain open after the integration time signal STINT transits from high into low to hold the left-over output voltage VOUT; the analog-to-digital conversion time is scheduled for the left-over voltage digitization. The most significant bits MSBs of the overall optical sensor arrangement 10 are generated by the number of charge packet dumping actions during the long integration time TINT. The most significant bit generation is similar to FIG. 1A to 1D. For extreme weak incident light, the integrated output voltage VOUT at the integrator output may be small enough such that there is no charge packet dumping, therefore, the MSBs may be zero.

In the second phase or second segment, just after the long integration time TINT, the photodiode 11 is disconnected from the amplifier 15 of the integrator and the left-over output voltage VOUT of the integrator output is sampled and held. Switches set by the signals S2, S4 are open also to conserve the left-over output voltage VOUT. This left-over output voltage VOUT is digitized by the sub-ranging analog-to-digital converter 50 that generates the least significant bits SLSB.

The digital output signal SDO is the combination of the first series of bits SMSB and the second series of bits SLSB. Since the output voltage VOUT at the integrator output might be overshooting above the comparator reference voltage VREFC, some kind of overlap scheme between the first series of bits SMSB and the second series of bits SLSB can be implemented.

If the optical sensor arrangement 10 is designed properly, for example, the switch leakage associated to the photodiode 11 is small enough, a very low photon current IPD can be collected by the integrator 15, 20 and the second series of bits SLSB can be an accurate representation of the weak incident light. For very weak incident light, the integrator comprising the amplifier 15 and the integrating capacitor 20 is used to hold the charge and a sub analog-to-digital conversion is used to digitize the held voltage, using a SAR method for example. The non-ideal charge injection problem is avoided. The long time integration accumulates also a weak sensor current IPD and the charge is held and is not disturbed resulting in a high sensitivity. The held charge is digitized by a separate analog-to-digital conversion, therefore a high accuracy is achieved.

For very strong incident light, the converter arrangement 12 performs charge-balancing analog-to-digital conversion. Therefore, an integrator saturation is avoided. These two methods are combined into a segmentation analog-to-digital conversion. Most significant bits are generated during long photon current integration time TINT by the number of charge packet dumping.

Figure 3A:
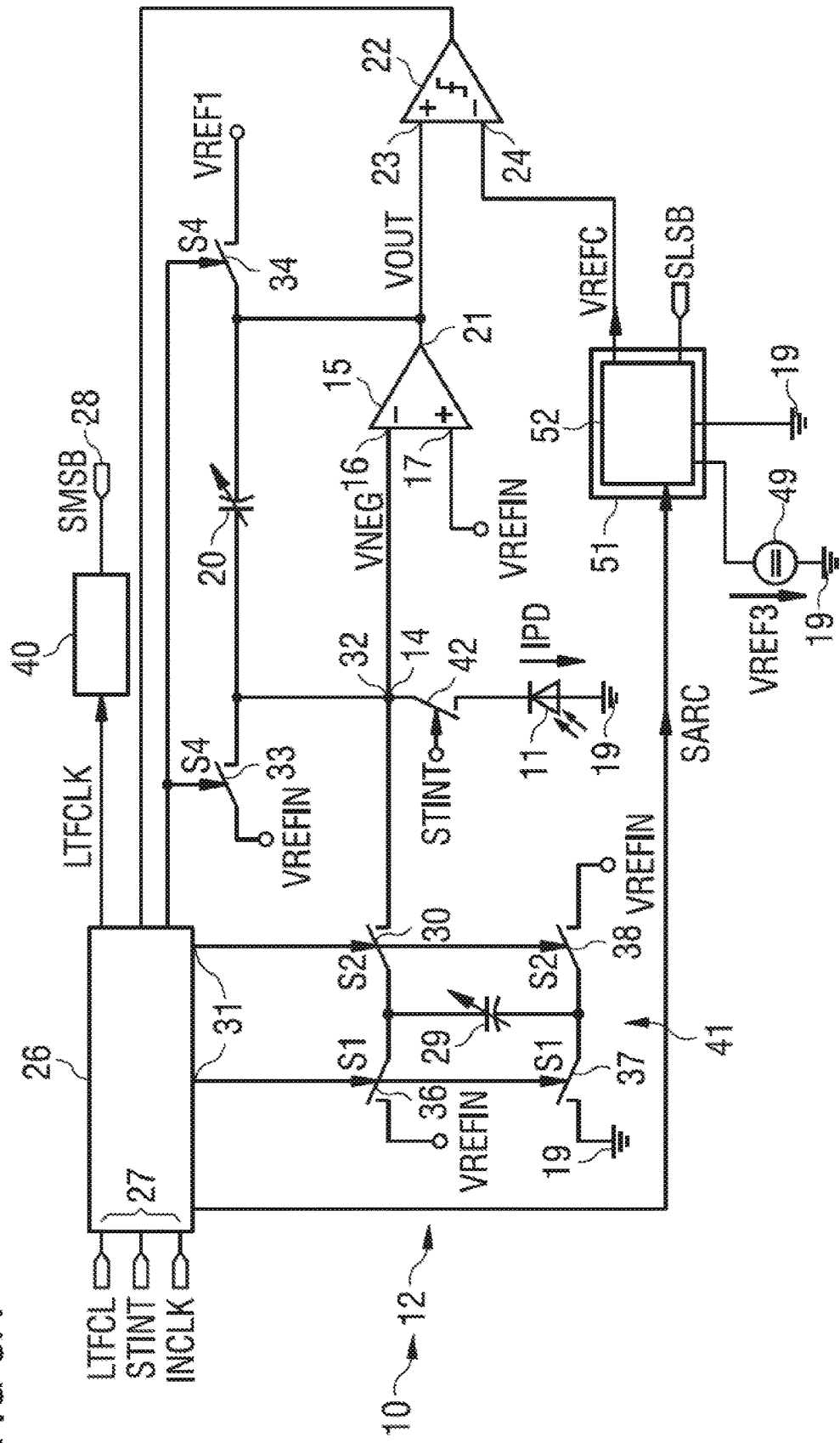
FIGS. 3A to 3D show further exemplary embodiments of the optical sensor arrangement and of a timing diagram.

FIG. 3A shows a further exemplary embodiment of the optical sensor arrangement which is a further development of the optical sensor arrangements shown in FIGS. 1A, 1B, 1D and 2A. The converter arrangement 12 comprises a reference voltage generator 51. The reference voltage generator 51 is coupled on its output side to the further comparator input 24. The reference voltage generator 51 is connected to a third reference source 49. Moreover, the reference voltage generator 51 is connected to the reference potential terminal 19. The digital control circuit 26 is coupled on its output side to the reference voltage generator 51 for controlling the reference voltage generator 51.

Thus, the digital control circuit 26 provides a control signal SARC to the reference voltage generator 51. A third reference voltage VREF3 is provided by the third reference source 49 to the reference voltage generator 51. The reference voltage generator 51 applies the comparator reference voltage VREFC to the further comparator input 24. The second series of bits SLSB is tapped at a further output of the reference voltage generator 51. The converter arrangement 12 uses the successive-approximation-register principle in the second phase B. The comparator 22 compares the reference voltage VREFC and the output voltage VOUT and provides the result of the comparison as the comparator signal SCOM to the digital control circuit 26. The digital control circuit 26 then determines the next value of the control signal SARC until the number of bits of the second series of bits SLSB is determined and the second series of bits SLSB can be tapped at the further output of the voltage reference generator 51.

The reference voltage generator 51 comprises a resistor ladder 52. The resistor ladder 52 is connected to the third reference source 49 and to the reference potential terminal 19. The resistor ladder 52 generates the comparator reference voltage VREFC. The comparator reference voltage VREFC is set by the resistor ladder 52 as a function of the control signal SARC. The resistor ladder 52 outputs the second series of bits SLSB.

Figure 3B:
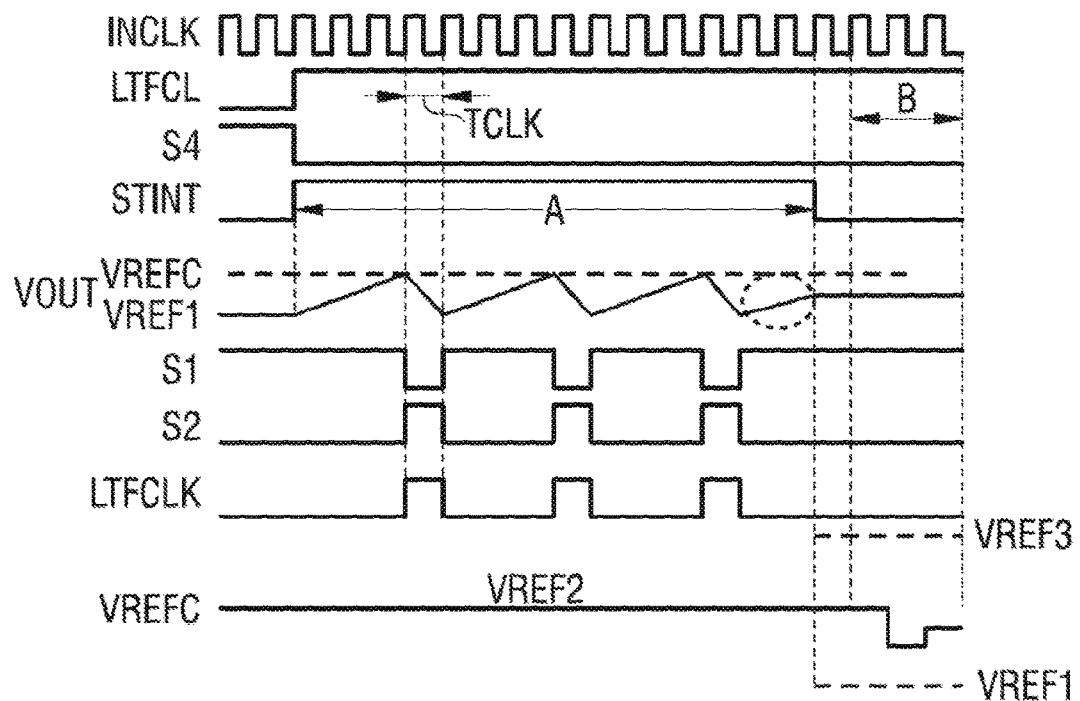

FIG. 3B shows an exemplary timing diagram of the optical sensor arrangement 10 according to FIG. 3A. The comparator reference voltage VREFC is constant in the first phase A and varies between the third reference voltage VREF3 and the first reference voltage VREF1 in the second phase B. Since the comparator 22 is already used in the first phase A during the long integration time TINT for charge packet dumping determination, it is possible to reuse said comparator 22 for the realization of the sub-ranging analog-to-digital converter 50. Instead of attaching another analog-to-digital converter to the amplifier output 21 the same comparator 22 that is used during long integration time for charge packet dumping is used again for later successive-approximation-register analog-to-digital conversion, abbreviated SAR analog-to-digital conversion. For the charge packet dumping, the comparator 22 uses the comparator reference voltage VREFC that is equal to the bias voltage VREF2. After the long photon current integration and the left-over output voltage VOUT is sampled and held, different values of the comparator reference voltage VREFC are applied to the comparator 22. These values of the comparator reference voltage VREFC are between the first reference voltage VREF1 and the third reference voltage VREF3 according to the SAR logic. The third reference voltage VREF3 is chosen to be larger than the bias voltage VREF2 such that non-overlap is implemented between main charge balancing analog-to-digital conversion and sub-ranging SAR analog-to-digital conversion: if the left-over voltage VOUT is larger than the bias voltage VREF2, then the first series of bits SMSB will be increased by one.

FIGS. 3A and 3B show an example where a 3-bit sub-ranging analog-to-digital conversion is used. It can be seen that after the integration time signal STINT transits from high to low, the converter arrangement 12 uses one clock cycle to set up, then three clock cycles are used for successive-approximation-register analog-to-digital conversion operation, abbreviated to SAR operation. During the SAR operation, the comparator 22 uses different reference voltages VREFC ranging between the first reference voltage VREF1 and the third reference voltage VREF3, generated from the resistor ladder 52, for example. The successive-approximation-register method is used for the sub-analog-to-digital conversion. Advantageously, the same comparator 22 is shared by both methods. The second series of bits SLSB comprise the 3 least significant bits, for example. The main analog-to-digital converter ADC and sub-analog-to-digital converter may overlap.

Figure 3C:
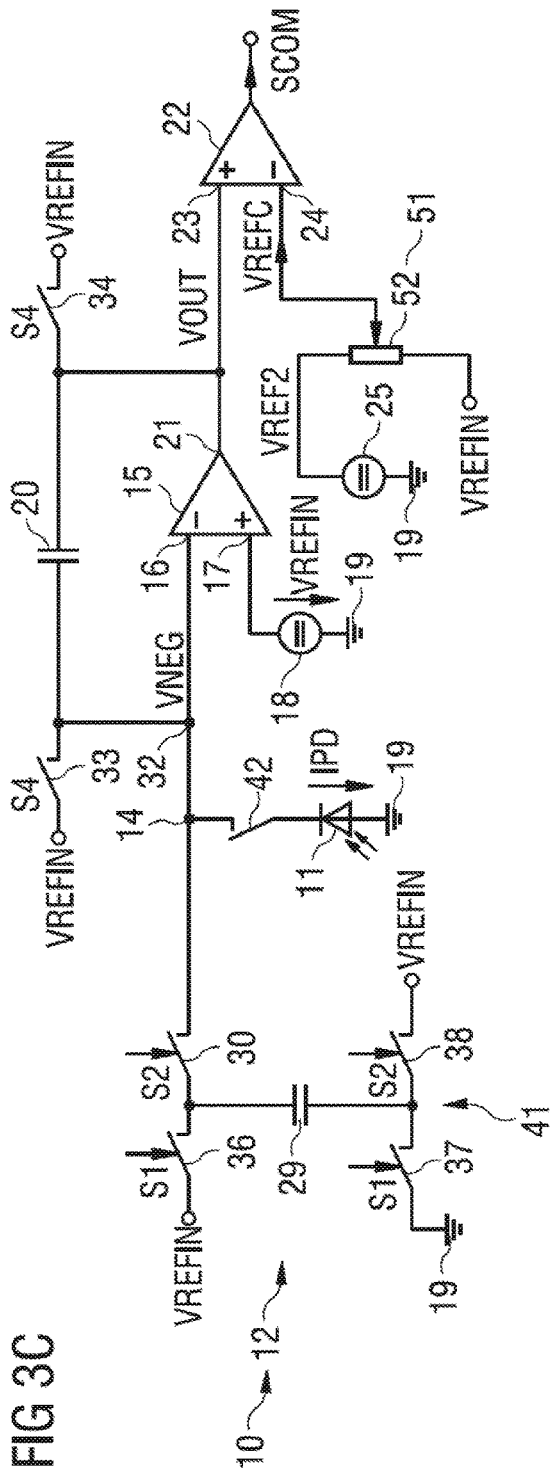

FIG. 3C shows a further exemplary embodiment of the optical sensor arrangement 10 which is a further development of the embodiments shown in FIGS. 1, 2 and 3A. In FIG. 3C the reference voltages which are provided to the reference capacitor 29, the integrating capacitor 20 and the further amplifier input 17 correspond to the reference voltages shown in FIG. 1D. The resistor ladder 52 is connected to the first bias source 18 and the reference voltage source 25. Thus, in the second phase B the comparator reference voltage VREFC, which can be tapped at the resistor ladder 52, follows the equation VREF2<VREFC<VREFIN, wherein VREF2 is the bias voltage and VREFIN is the amplifier reference voltage. The resistor ladder 52 is used for generating additional bits using a successive-approximation-register algorithm.

Figure 3D:
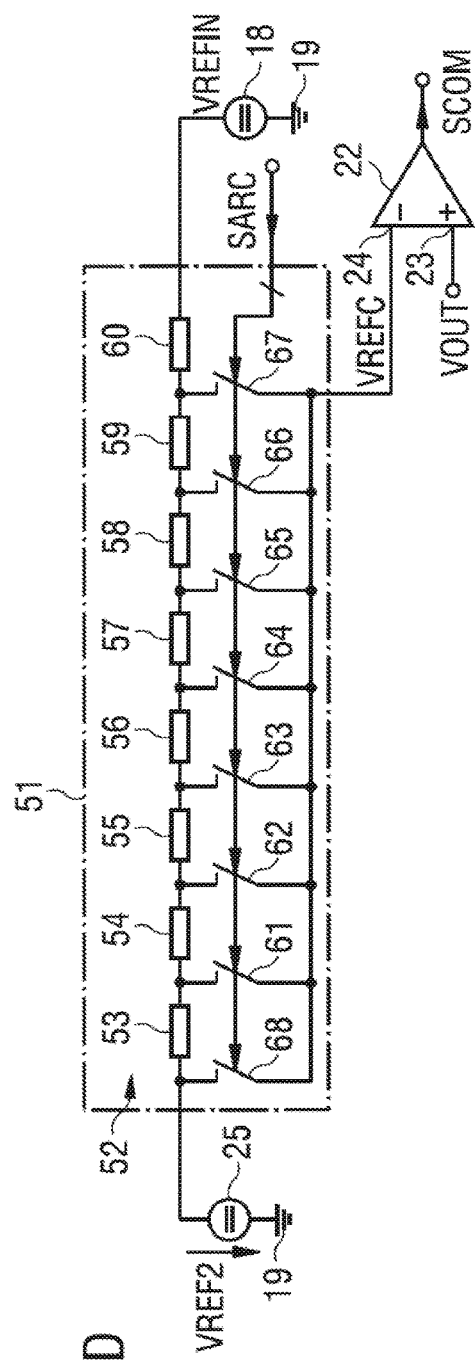

FIG. 3D shows an exemplary embodiment of a resistor ladder 52 which can be used in the embodiments shown in FIGS. 3A and 3C. The resistor ladder 52 comprises a number M of resistors 53 to 60. The number M of resistors can be calculated according to the following equation:

$$M=2^N,$$

wherein N is the number of bits of the second series of bits SLSB. The taps between the number M of resistors 53 to 60 are connected via resistor switches 61 to 67 to the further comparator input 24. A further resistor switch 68 connects the reference voltage source 25 to the further comparator input 24. In the first phase of operation A, the further resistor switch 68 is closed by the control signal SARC. Thus, the bias voltage VREF2 is constantly provided to the further comparator input 24 in the first phase A. In the second phase of operation B, the further resistor switch 68 is opened and the digital control circuit 26 selects one of the resistor switches 61 to 67 that is to be closed. The resistors 53 to 60 have an equal resistance value.

Figure 4A:
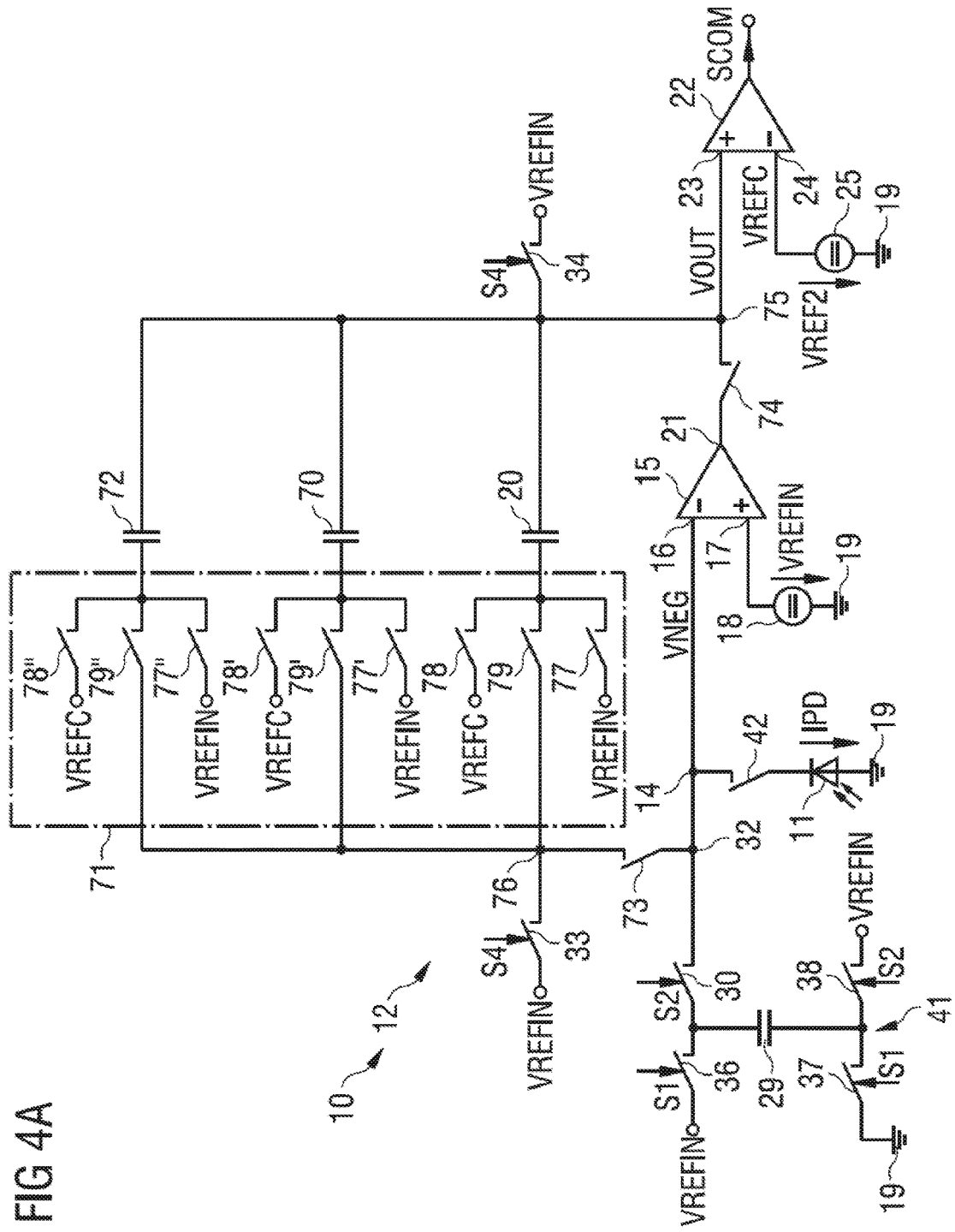
FIGS. 4A and 4B show further exemplary embodiments of the optical sensor arrangement.

FIG. 4A shows a further exemplary embodiment of the optical sensor arrangement 10 which is a further development of the embodiments shown in one of the above-described figures. The converter arrangement 12 comprises a further integrating capacitor 70 and a switching arrangement 71. The further integrating capacitor 70 is connected in parallel to the integrating capacitor 20 via the switching arrangement 71. Furthermore, the converter arrangement 12 comprises an additional integrating capacitor 72 that is also connected in parallel to the integrating capacitor 20 via the switching arrangement 71. A capacitance value of the integrating capacitor 20 is twice as large as the capacitance value of the further integrating capacitor 70. A capacitance value of the further integrating capacitor 70 is as large as twice the capacitance value of the additional integrating capacitor 72.

The switching arrangement 71 comprises a first capacitor switch 77 that couples the first electrode of the integrating capacitor 20 to the first voltage reference source 18. Moreover, the switching arrangement 71 comprises a second capacitor switch 78 that couples the first electrode of the integrating capacitor 20 to the reference voltage source 25. Additionally, the switching arrangement 71 comprises a third capacitor switch 79 coupling the first electrode of the integrating capacitor 20 to an input node 76.

Correspondingly, the switching arrangement 71 comprises a further first capacitor switch 77' that couples the first electrode of the further integrating capacitor 70 to the first voltage reference source 18. The switching arrangement 71 comprises a further second capacitor switch 78' that couples the first electrode of the further integrating capacitor 70 to the reference voltage source 25. Additionally, the switching arrangement 71 comprises a further third capacitor switch 79' coupling the first electrode of the further integrating capacitor 70 to the input node 76.

Similarly, the switching arrangement 71 comprises an additional first capacitor switch 77" that couples the first electrode of the additional integrating capacitor 72 to the first voltage reference source 18. The switching arrangement 71 comprises an additional second capacitor switch 78" that couples the first electrode of the additional integrating capacitor 70 to the reference voltage source 25. Additionally, the switching arrangement 71 comprises an additional third capacitor switch 79" coupling the first electrode of the additional integrating capacitor 72 to the input node 76.

The second electrodes of each of the integrating capacitors 20, 70, 72 are connected to an output node 75.

Moreover, the converter arrangement 12 comprises a first and a second separating switch 73, 74. The first separating switch 73 connects the integrating node 32 to the input node 76 and, thus, to the switching arrangement 71 and the integrating capacitors 20, 70, 72. The second separating switch 74 couples the amplifier output 21 to the output node 75. The output node 75 is arranged between the switching arrangement 71 and the integrating capacitors 20, 70, 72 on one side and the comparator input 23 on the other side.

In the first phase A, the first and the second separating switches 73, 74 are closed. In the first phase A, the integrating capacitors 20, 70, 72 are switched in parallel by the switching arrangement 71. Thus, the first electrodes of the integrating capacitors 20, 70, 72 are connected to each other and the second electrodes of the integrating capacitors 20, 70, 72 are also connected to each other. The converter arrangement 12 operates in the first phase A as shown in FIGS. 1 to 3.

In the second phase B, the first and the second separating switches 73, 74 are opened. In the second phase B, each of the first electrodes of the integrating capacitors 20, 70, 72 can either be switched to the first bias source 18 or to the reference voltage source 25 by the switching arrangement 71. The sum of the charges on the second electrode of the integrating capacitors 20, 70, 72 is constant during the second phase B. Firstly, the first capacitor switch 77 is closed and the second and third capacitor switches 78, 79 are open. Thus, the first reference voltage VREF1 is provided to the first electrode of the integrating capacitor 20. By opening the first capacitor switch 77 and closing the second capacitor switch 78, the comparator reference voltage VREFC is provided to the first electrode of the integrating capacitor 20. The change of the voltage at the first electrode of the integrating capacitor 20 from the first reference voltage VREF1 to the comparator reference voltage VREFC changes the output voltage VOUT in such a manner that the output voltage VOUT increases. When the changed output voltage VOUT is larger than the comparator reference voltage VREFC, the comparator 22 provides a comparator output signal SCOM with another value.

In the second phase B, the digital control circuit 26 changes the position of the first and the second capacitor switches 77, 77', 77", 78, 78', 78" to find a minimum of the integrating capacitance that results in a changed output voltage VOUT that is larger than the comparator reference voltage VREFC. The control signals for setting the first and the second capacitor switches 77, 77', 77", 78, 78', 78" can be used to determine the second series of bits SLSB. The second series of bits SLSB are determined by a capacitive method. Thus, power consumption of the converter arrangement 12 is low.

In FIG. 4A, the integrating capacitors 20, 70, 72 are realized as binary weighted capacitors and used as a capacitive digital-to-analog converter. The comparator reference voltage VREFC follows the equation:

$$VREF1 < VREFC < VREF2 + \frac{VREF2 - VREF1}{2}$$

In an alternative embodiment not shown, the converter arrangement 12 comprises at least one further integrating capacitor that is connected in parallel to the integrating capacitor 20, the further integrating capacitor 70 and the additional integrating capacitor 72 via the switching arrangement 71. In general, the converter arrangement 12 comprises at least two integrating capacitors.

In an alternative embodiment not shown, the second separating switch 74 can be omitted. The amplifier 15 obtains a high ohmic output since the output impedance at the amplifier output 21 is high and a current flow from the node 75 to the amplifier 15 is avoided. Thus, a conservation of the charge on the second electrodes of the integrating capacitors 20, 70, 72 is achieved without the second separating switch 74.

Figure 4B:
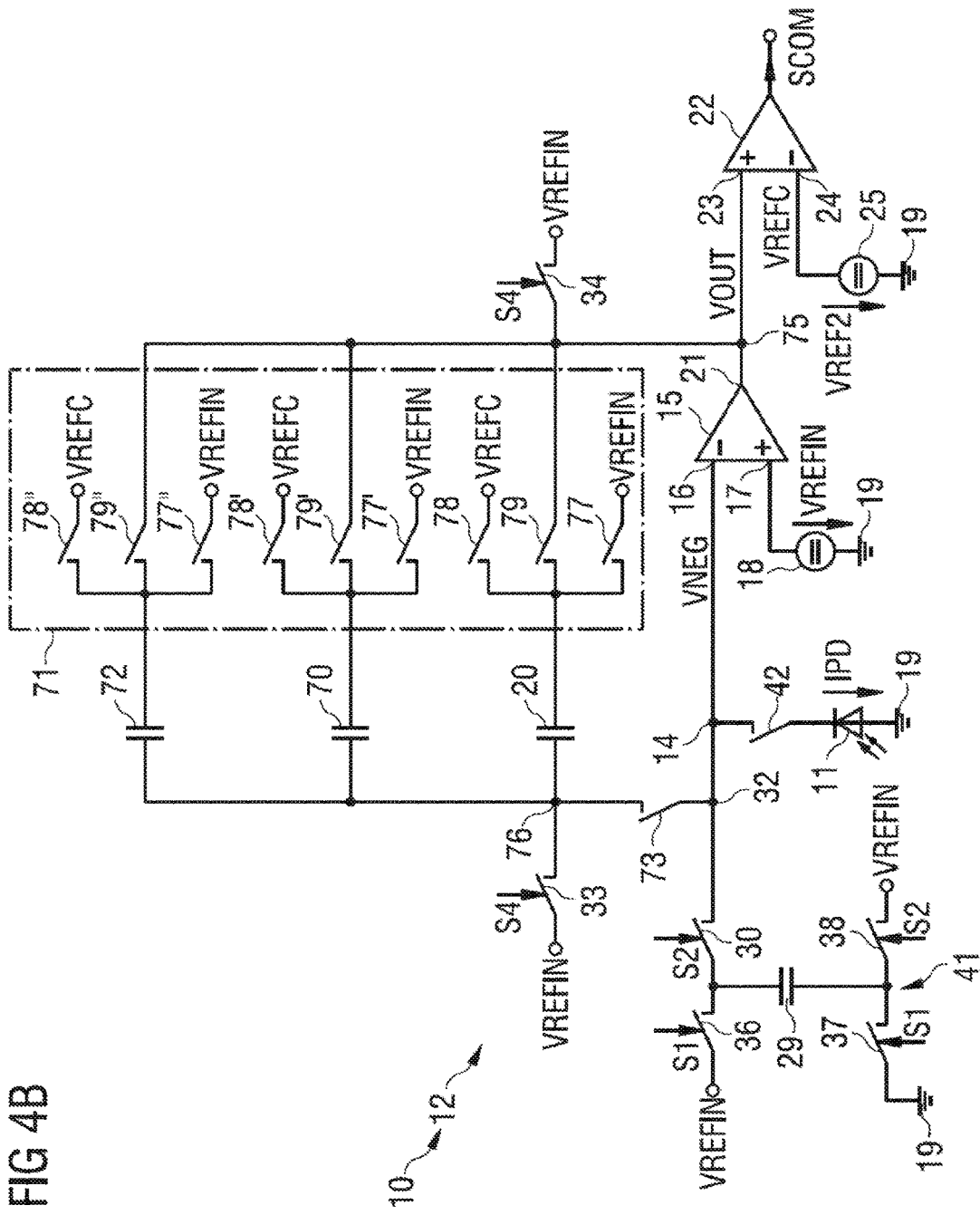

FIG. 4B shows a further exemplary embodiment of the optical sensor arrangement 10 which is a further development of the above-shown embodiments. The switching arrangement 71 is arranged between the integrating capacitors 20, 70, 72 and the output node 75. Thus, the first electrodes of the integrating capacitors 20, 70, 72 are directly connected to the input node 76. The second electrode of the integrating capacitor 20 is connected via the first capacitor switch 77 to the first bias source 18, via the second capacitor switch to the reference voltage source 25 and via the third capacitor switch 79 to the output node 75. The second electrode of the further integrating capacitor 20 is connected via the further first capacitor switch 77' to the first bias source 18, via the further second capacitor switch 78' to the reference voltage source 25 and via the further third capacitor switch 79' to the output node 75. The second electrode of the additional integrating capacitor 72 is connected via the additional first capacitor switch 77" to the first bias source 18, via the additional second capacitor switch 78" to the reference voltage source 25 and via the additional third capacitor switch 79" to the output node 75.

In the first phase A, the third capacitor switches 79, 79", 79" and the first separating switch 73 are closed. In the second phase, the first separating switch 73 is also closed. The amplifier output 21 is connected to the output node 75. The amplifier 15 acts as a comparator. The amplifier has a high open loop gain. In the second phase B, no charge dumping occurs. The input voltage VNEG at the amplifier input 16 can be changed by changing the voltage at the second electrode of the integrating capacitor 20 or the second electrode of the further integrating capacitor 70 or the second electrode of the additional integrating capacitor 72 from the first reference voltage VREF1 to the comparator reference voltage VREFC. First, the first reference voltage VREF1 is provided to the second electrodes of the integrating capacitors 20, 70, 72. Thus, the value of the input voltage VNEG is smaller than the value of the first reference voltage VREF1. By increasing the voltages at the second electrodes of one, two or three of the integrating capacitors 20, 70, 72 the value of the input voltage VNEG also increases. The minimum capacitance value of the sum of three integrating capacitors 20, 70, 72 at which the input voltage VNEG becomes larger than the first reference voltage VREF1 refers to a crossover point. The state of the capacitor switches 77, 77', 77", 78, 78', 78", 79, 79', 79" at the crossover point determines the second series of bits SLSB.

If the bottom electrodes of the integrating capacitors 20, 70, 72 may degrade performance, the amplifier 15 can be used as comparator. The embodiment achieves also lower leakage at the input 14 as no additional switches are required at the input 14.

Figure 5A:
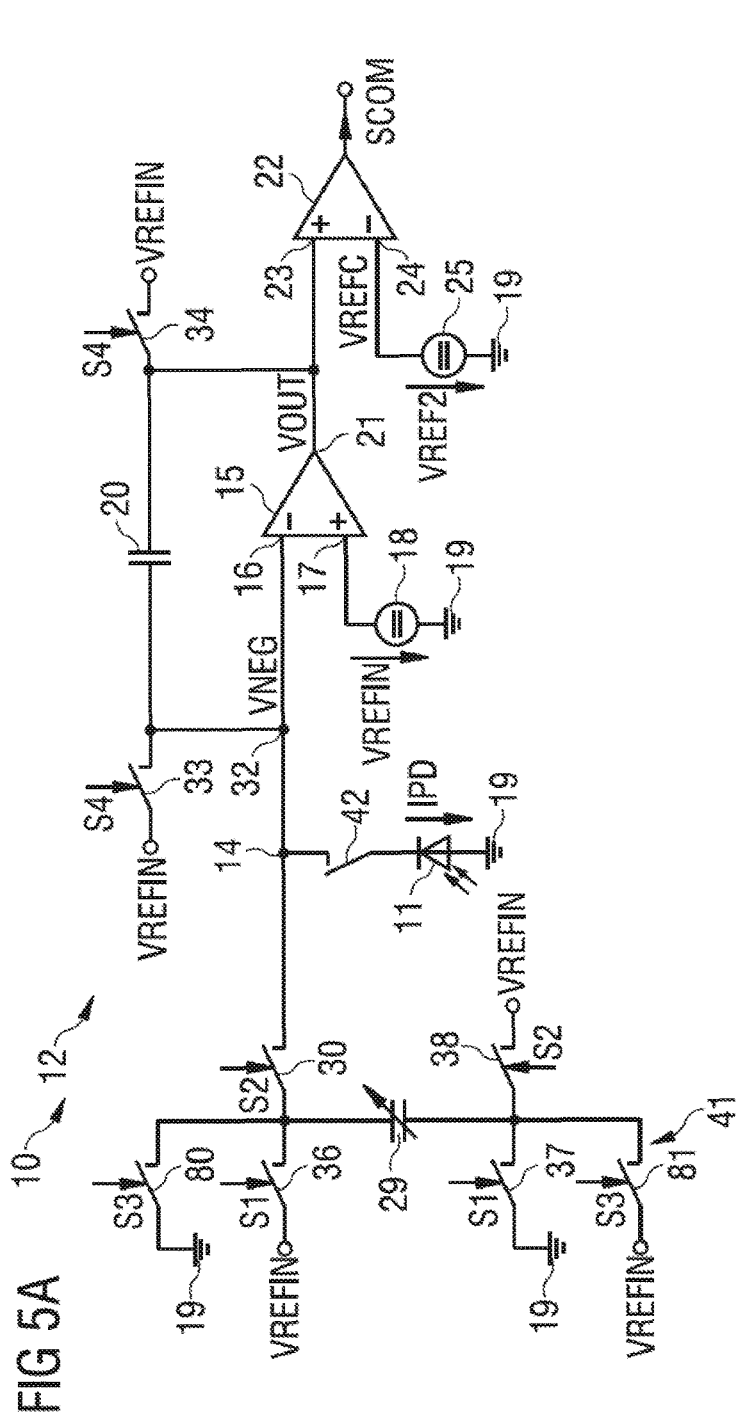
FIGS. 5A and 5B show a further exemplary embodiment of the optical sensor arrangement.

FIG. 5A shows a further exemplary embodiment of the optical sensor arrangement which is a further development of the above-shown embodiments. The converter arrangement 12 operates in the first phase A as shown above. The reference capacitor 29 is designed as a variable capacitor. The switching network 41 comprises a fourth and a fifth reference switch 80, 81. The fourth reference switch 80 couples the first electrode of the reference capacitor 29 to the reference potential terminal 19. The fifth reference switch 81 couples the second electrode of the reference capacitor 29 to the first bias source 18. The fourth and the fifth reference switch 80, 81 are controlled by a third reference switch signal S3 provided by the digital control circuit 26. The reference capacitor 29 provides a positive charge to the amplifier input 16 in FIGS. 1 to 4. If the fourth and the fifth reference switches 80, 81 are closed, the reference capacitor 29 is negatively charged and provides a negative charge to the amplifier input 16. Thus, the value of the output voltage VOUT increases in the case charge dumping occurs. In the second phase B, the output voltage VOUT is increased by charge dumping processes until the output voltage VOUT becomes larger than the comparator reference voltage VREFC.

The converter arrangement 12 uses the reference capacitor 29 as a capacitive digital-to-analog converter together with the integrator comprising the amplifier 15 and the integrating capacitor 30. The converter arrangement 12 adds/subtracts a voltage VREFIN/x at the end of the conversion depending on the comparator output signal SCOM.

Figure 5B:
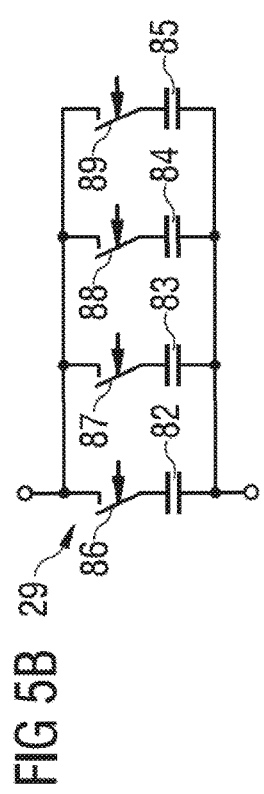

FIG. 5B shows an exemplary embodiment of the reference capacitor 29 that can be used in the optical sensor arrangement of FIG. 5A. The reference capacitor 29 is implemented as a capacitor bank. The capacitor bank comprises a number L of capacitors 82-85 and a number L of reference capacitor switches 86-89. Thus, a number L of series circuits each comprise a capacitor 82-85 and a reference capacitor switch 86-89. The number L of series circuits are connected in parallel and form the reference capacitor 29. The number L of reference capacitor switches 86-89 are controlled by the control signal SARC. A capacitance value of a first capacitor 82 is twice a capacitance value of a second capacitor 83. The capacitance value of the second capacitor 83 is twice a capacitance value of a third capacitor 84. In case the number L is four, the third capacitor 84 and a fourth capacitor 85 have equal capacitance values. If the number L of reference capacitor switches 86-89 are closed, the reference capacitor 29 obtains its maximum capacitance value.

In the second phase B, a negative charge dumping is performed by means of the first capacitor 82 having the largest capacitance value. If the output voltage VOUT is still smaller than the comparator reference voltage VREFC, a negative charge dumping is performed by means of the second capacitor 83. If, however, the first charge dumping results in an output voltage VOUT that is larger than the comparator reference voltage VREFC, a positive charge dumping using the second capacitor 83 is performed. By an appropriate series of positive and negative charge dumping processes using the first capacitor 82, having the largest capacitance value, and then the second capacitor 83 having a smaller capacitance value, and moreover the third capacitor 84 having the smallest capacitance value, the second series of bits SLSB can be determined.

The reference capacitor 29 as shown in FIG. 5B can also be inserted in the converter arrangement 12, as shown in FIGS. 1 to 4.

The ambient light sensor architecture obtains two segmentations, namely a charge-balancing scheme and a sub-ranging analog-to-digital conversion scheme. The sub-ranging analog-to-digital conversion scheme may be implemented as a successive-approximation-register scheme. The timing scheme combines the charge-balancing scheme and the sub-ranging analog-to-digital conversion scheme.

In an alternative not shown embodiment a sub-ranging SAR analog-to-digital conversion can be implemented as algorithmic analog-to-digital conversion, for example re-using the amplifier 15, the integration capacitor 20 and the comparator 22.

Figure 6:
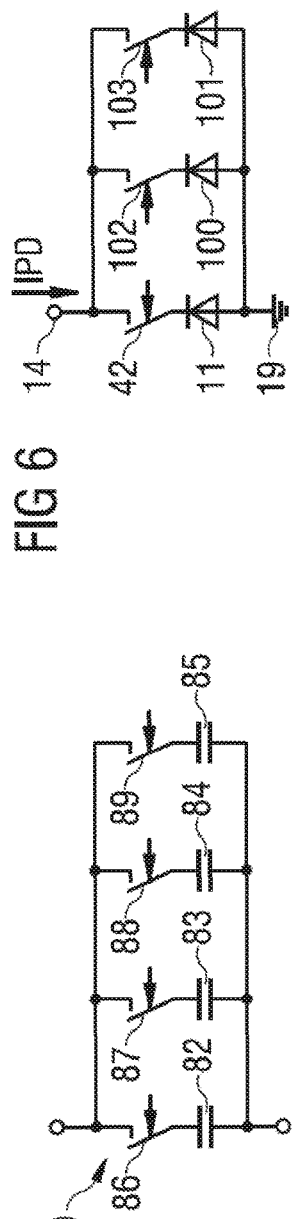
FIG. 6 shows an exemplary embodiment of a photodiode configuration.

FIG. 6 shows an alternative embodiment of a detail of the optical sensor arrangement 10. The optical sensor arrangement 10 comprises at least one further photodiode 100, 101 and at least one further photodiode switch 102, 103. The at least one further photodiode 100, 101 forms a series circuit with the corresponding at least one further photodiode switch 102, 103. The sensor current IDP is increased if the at least one further photodiode 100, 101 is connected in parallel to the photodiode 11. Thus, in case of low brightness, the sensor current IPD is increased in such a manner that the sensor current IPD can be digitized with high accuracy. In the case of high brightness, only one of the photodiode switches 42, 102, 103 is closed. The circuit comprising the photodiode 11 and the at least one further photodiode 100, 101 can be programmed for different ambient light sensing gains. Consequently, the optical sensor arrangement 10 can be operated with optimized conditions in order to achieve a highly accurate digital output signal SDO consisting of the first and the second series of bits SMSB, SLSB.

An ambient light sensing gain control scheme can be achieved by configuring at least one of the integrating capacitor 20, the reference capacitor 29 and the photodiode 11 into different sizes.

We claim:

1. An optical sensor arrangement, comprising:
a photodiode for providing a sensor current; and
an analog-to-digital converter arrangement which is coupled to the photodiode and determines a digital value of the sensor current in a charge balancing operation in a first phase and in another conversion operation in a second phase,
wherein the analog-to-digital converter arrangement comprises
an amplifier having an amplifier input and an amplifier output, and
a comparator having a comparator input coupled to the amplifier output,
wherein the photodiode is coupled to the amplifier input, and
wherein the analog-to-digital converter arrangement comprises a resistor ladder having an output that is coupled to a further comparator input of the comparator and is designed to provide a comparator reference voltage that is controllable to the further comparator input in the second phase.

2. The optical sensor arrangement according to claim 1, wherein the digital value of the sensor current comprises
a first series of bits which is determined in the first phase and comprises the most significant bit, and
a second series of bits which is determined in the second phase and comprises the least significant bit.

3. The optical sensor arrangement according to claim 1, wherein the analog-to-digital converter arrangement comprises an analog-to-digital converter coupled to the amplifier output and designed to operate in the second phase.

4. The optical sensor arrangement according to claim 1, wherein at least one of the amplifier and the comparator are used in the first phase as well as in the second phase.

5. An optical sensor arrangement, comprising:
a photodiode for providing a sensor current; and
an analog-to-digital converter arrangement which is coupled to the photodiode and determines a digital value of the sensor current in a charge balancing operation in a first phase and in another conversion operation in a second phase,
wherein the analog-to-digital converter arrangement comprises
an amplifier having an amplifier input and an amplifier output, and
a comparator having a comparator input coupled to the amplifier output,
wherein the photodiode is coupled to the amplifier input,
wherein the analog-to-digital converter arrangement comprises an integrating capacitor which is coupled between the amplifier output and the amplifier input, and
wherein the analog-to-digital converter arrangement comprises at least a further integrating capacitor which is coupled parallel to the integrating capacitor via a switching arrangement.

6. The optical sensor arrangement according to claim 5, wherein the switching arrangement, the integrating capacitor and the at least one further integrating capacitor are designed to selectively decrease or increase an input voltage at the comparator input in the second phase.

7. An optical sensor arrangement, comprising:
a photodiode for providing a sensor current; and
an analog-to-digital converter arrangement which is coupled to the photodiode and determines a digital value of the sensor current in a charge balancing operation in a first phase and in another conversion operation in a second phase,
wherein the analog-to-digital converter arrangement comprises
an amplifier having an amplifier input and an amplifier output, and
a comparator having a comparator input coupled to the amplifier output,
wherein the photodiode is coupled to the amplifier input, and
wherein the analog-to-digital converter arrangement comprises a reference capacitor which is coupled to the amplifier input and which is designed for providing a charge package to the amplifier input at least in the first phase.

8. The optical sensor arrangement according to claim 7, wherein the reference capacitor is designed such that a capacitance value of the reference capacitor is set by a control signal in the second phase.

9. The optical sensor arrangement according to claim 7, wherein the analog-to-digital converter arrangement comprises a switching network that is coupled to the reference capacitor and is designed to selectively decrease or increase an input voltage that is provided to the amplifier input in the second phase.

10. The optical sensor arrangement according to claim 1, wherein the analog-to-digital converter arrangement comprises a further photodiode and a further photodiode switch such that a series connection of the further photodiode and the further photodiode switch couples the amplifier input to a reference potential terminal.

11. An method for light sensing, comprising:
generating a sensor current by a photodiode;
providing the sensor current to an analog-to-digital converter arrangement; and
determining a digital value of the sensor current by the analog-to-digital converter arrangement in a charge balancing operation in a first phase and in another conversion operation in a second phase, wherein the analog-to-digital converter arrangement comprises an amplifier, a comparator and a resistor ladder, wherein the photodiode is coupled to an amplifier input of the amplifier, an amplifier output of the amplifier is coupled to a comparator input of the comparator, and an output of the resistor ladder is coupled to a further comparator input of the comparator, and wherein the resistor ladder provides a comparator reference voltage that is controllable to the further comparator input in the second phase.

* * * * *